United States Patent [19]

Nakamura

[11] Patent Number: 5,739,717
[45] Date of Patent: Apr. 14, 1998

[54] SEMICONDUCTOR LIGHT EMITTING ELEMENT DRIVING CIRCUIT

[75] Inventor: Hiroyuki Nakamura, Atsugi, Japan

[73] Assignee: Canon Kabushiki Kaisha, Tokyo, Japan

[21] Appl. No.: 424,179

[22] Filed: Apr. 19, 1995

[30] Foreign Application Priority Data

Apr. 22, 1994 [JP] Japan ................................. 6-084576
Jun. 6, 1994 [JP] Japan ................................. 6-147080

[51] Int. Cl.$^6$ ............................ H01L 31/00; H03K 17/60
[52] U.S. Cl. ......................... 327/514; 327/65; 327/108; 327/432
[58] Field of Search ................................. 327/514, 515, 327/432, 433, 65, 77, 108; 326/110

[56] References Cited

U.S. PATENT DOCUMENTS

| | | | |
|---|---|---|---|
| 4,539,686 | 9/1985 | Bosch et al. | 372/26 |
| 4,581,542 | 4/1986 | Steigerwald | 327/440 |
| 4,709,370 | 11/1987 | Bednarz et al. | 372/38 |
| 4,853,530 | 8/1989 | Muto | 250/214 |
| 5,124,580 | 6/1992 | Matthews et al. | 326/110 |
| 5,126,689 | 6/1992 | Nakamura | 330/296 |
| 5,283,537 | 2/1994 | Nakamura | 330/288 |
| 5,341,042 | 8/1994 | Chen | 326/110 |

FOREIGN PATENT DOCUMENTS

| | | | |
|---|---|---|---|
| 0186385 | 2/1986 | European Pat. Off. | H03K 19/00 |
| 0469244 | 5/1992 | European Pat. Off. | H04B 10/14 |
| 0563580 | 6/1993 | European Pat. Off. | H01S 3/096 |
| 0583688 | 2/1994 | European Pat. Off. | H03K 17/60 |
| 2296382 | 12/1990 | Japan . | |
| WO 93/17498 | 9/1993 | WIPO | H03K 17/16 |

OTHER PUBLICATIONS

Patent Abstracts of Japan, vol. 16, No. 567 (E-1296) 8 Dec. 1992 & JP-A-04 219 985 (NEC Corp) 11 Aug. 1992 *abstract*.
Patent Abstracts of Japan, vol. 14, No. 18 (E-873) (3961) 16 Jan. 1990 & JP-A-01 261 918 (Hitachi LTD) 18 Oct. 1989 *abstract*.
Patent Abstracts of Japan, vol. 12, No. 162 (E-609) (3009) 17 May 1988 & JP-A-62 273 787 (Matsushita Electric Ind Co Ltd) 27 Nov. 1987 *abstract*.
Patent Abstracts of Japan, vol. 15, No. 412 (E-1124) 21 Oct. 1991 & JP-A-03 171 687 (Matsushita Electric Ind Co Ltd) 25 Jul. 1991 *abstract*.
Patent Abstracts of Japan, vol. 13, No. 226 (E-763) 25 May 1989 & JP-A-01 033 976 (NEC Corp) 3 Feb. 1989 *abstract*.
Patent Abstracts of Japan, vol. 14, No. 229 (E-0928) 15 May 1990 & JP-A-02 058 881 (Canon Inc) 28 Feb. 1990 *abstract*.
Patent Abstracts of Japan, vol. 15, No. 78 (E-1037) 22 Feb. 1991 & JP-A-02 296 382 (Mitsubishi Electric Corp) 6 Dec. 1990 *abstract*.

*Primary Examiner*—Toan Tran
*Attorney, Agent, or Firm*—Fitzpatrick, Cella, Harper & Scinto

[57] ABSTRACT

A semiconductor light emitting element driving circuit for driving a light emitting element, comprises a bipolar transistor, a base of which is applied with a control signal for driving the light emitting element, and which, in response to the control signal, drives the light emitting element by flowing a current between an emitter and a collector, and a gate insulated transistor which operates as a constant current source connected to the bipolar transistor.

12 Claims, 10 Drawing Sheets

$\omega_0^2 > \tau^{-2}$ $\omega_0^2 < \tau^{-2}$ $\omega_0^2 = \tau^{-2}$

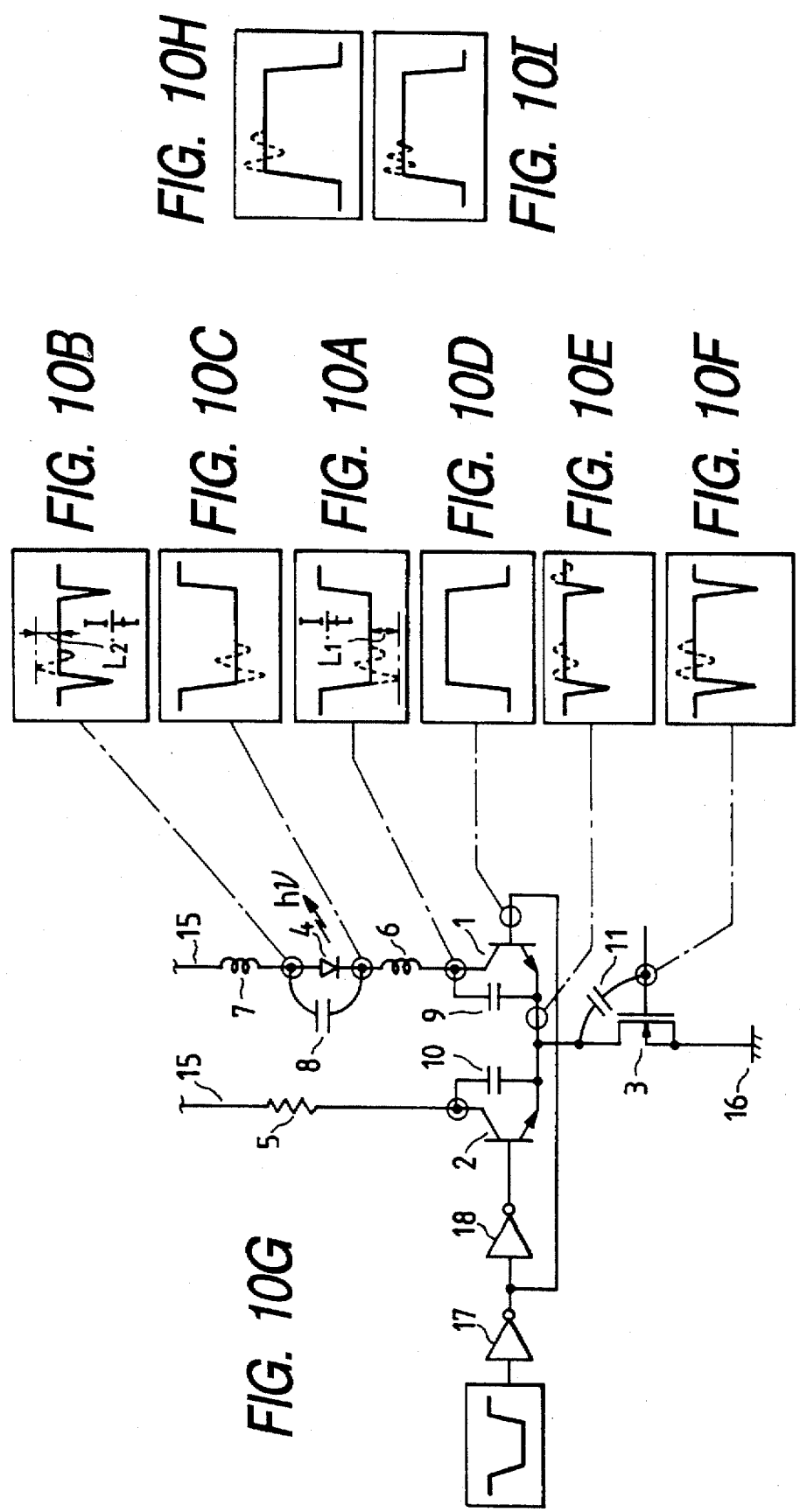

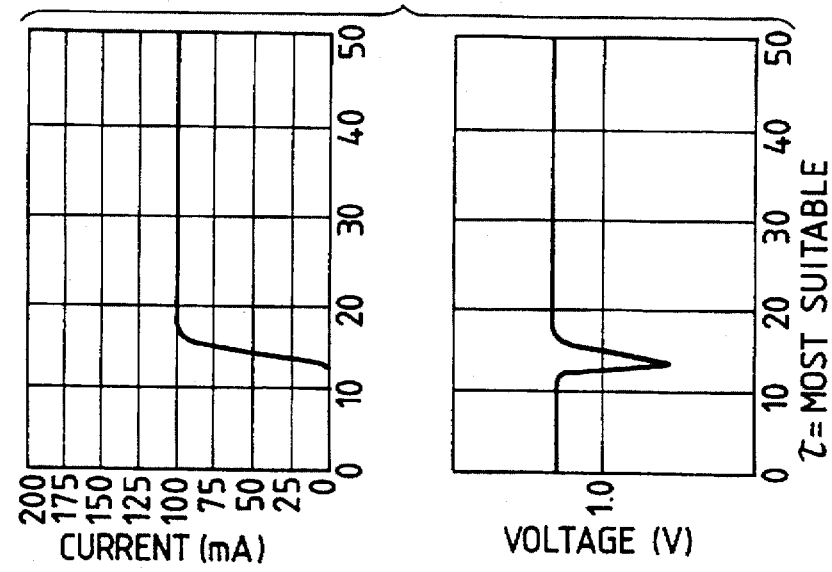
FIG. 11C  τ = MOST SUITABLE
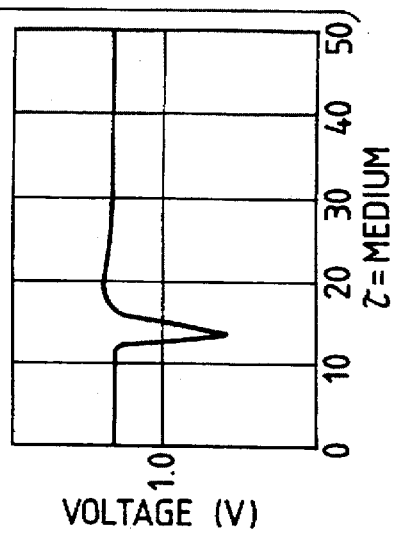
FIG. 11B  τ = MEDIUM
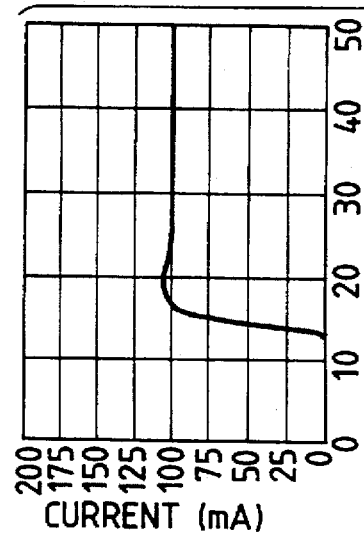
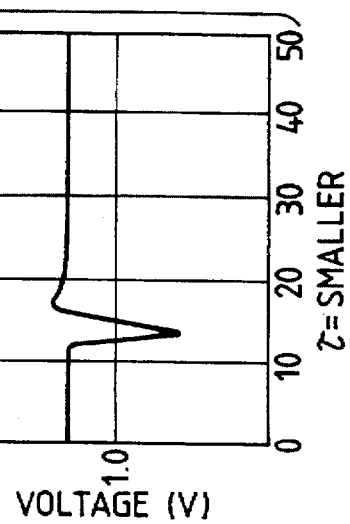
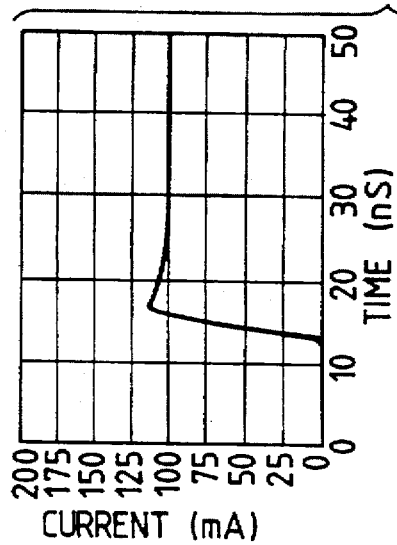
FIG. 11A  τ = SMALLER

SEMICONDUCTOR LIGHT EMITTING ELEMENT DRIVING CIRCUIT

BACKGROUND OF THE INVENTION

1. Field of the Invention

The present invention relates to a semiconductor light emitting element driving circuit used as an LED driving circuit for displays, indicators, or LED printer heads, as a laser source driving circuit for optical disk apparatuses, exposure apparatuses for IC fabrication, or laser beam printers, or as a driving circuit for light emitting elements for optical communications.

2. Related Background Art

Driving circuits for semiconductor light emitting elements represented by light emitting diodes (LEDs) and semiconductor lasers are classified into two categories: a cathode common circuit and an anode common circuit.

In the cathode common circuit, the cathode of a light emitting element is connected to a low-potential reference voltage source, and its anode is connected to a constant current source.

In the anode common circuit, the anode of a light emitting element is connected to a high-potential reference voltage source, and its cathode is connected to a switching circuit and a constant current source.

One example of the former circuit is disclosed in Japanese Laid-Open Patent Application No. 2-296382. The latter circuit is expected as a future mainstream circuit since its switching speed is higher than that of the former.

FIG. 1 is a circuit diagram showing an example of a conventional semiconductor light emitting element driving circuit.

Referring to FIG. 1, this driving circuit consists of differentially connected bipolar transistors 1 and 2; a bipolar transistor 3 which operates with a constant current; a semiconductor light emitting element 4; a resistor 5; an inductance 6 of the line which connects the bipolar transistors for driving the semiconductor light emitting element and the semiconductor light emitting element; an inductance 7 of the line which connects the semiconductor light emitting element and a power supply; a junction capacitance 8 of the semiconductor light emitting element; collector-emitter capacitances 9 and 10 of the bipolar transistors 1 and 2, respectively; and a base-collector capacitance 11 of the bipolar transistor 3.

As in FIG. 1, in this semiconductor light emitting element driving circuit constituted by a conventional semiconductor integrated circuit, the emitters of the differentially connected bipolar transistors 1 and 2 are connected to the collector of the bipolar transistor 3 which has the same conductivity type and operates as a constant current source.

Unfortunately, in an arrangement such as this prior art shown in FIG. 1 the current waveform for driving a semiconductor light emitting element is in some instances significantly distorted.

FIG. 2 is a view for explaining the mechanism in which the driving current for the semiconductor light emitting element is distorted in the configuration illustrated in FIG. 1. This mechanism will be described below with reference to FIG. 2.

The semiconductor light emitting element 4 needs to be switched at a high speed with a constant current of about a few milliamperes to 100 milliamperes. Assume that the value of this constant current is I and the values of the inductances 6 and 7 are $L_1$ and $L_2$, respectively. Assuming the time during which the transistor 1 is activated from a cut-off state and the current flowing through the semiconductor light emitting element 4 reaches the constant current value I from substantially zero is t, counterelectromotive voltages $V_1$ and $V_2$ produced in the inductances 6 and 7, respectively, by this current change are $$V_1 = L_1 \cdot I/t, \quad V_2 = L_2 \cdot I/t$$

$V_1$ is transmitted to the base of the transistor 3 through the collector-emitter capacitance 9 of the transistor 1 and the base-collector capacitance 11 of the transistor 3. Likewise, $V_2$ is transmitted to the base of the transistor 3 through the junction capacitance 8 of the semiconductor light emitting element 4 and the capacitances 9 and 11.

The mutual conductance, $g_m$, of the bipolar transistors is expressed as follows:

$$g_m = \partial I_C / \partial V_{BE} = q I_C / kT$$

That is, a change in the potential applied to the base produces as a large change in the collector current. In this conventional arrangement, therefore, a potential variation occurring in the line inductance is transmitted to the base of the transistor 3 which operates with a constant current, thus distorting the collector current, i.e., the driving current waveform of the semiconductor light emitting element.

This distortion in the waveform is represented by overshoot or ringing. If overshoot takes place, a semiconductor light emitting element deteriorates, and this consequently reduces the life of a product using this semiconductor light emitting element.

Examples of techniques for preventing this include circuit configurations shown in FIGS. 3 and 4. In FIG. 3, a snubber circuit consisting of a resistor 12 and a capacitor 13 is additionally provided externally to the package incorporating a semiconductor light emitting element driving circuit. In FIG. 4, the emitters that are differentially connected and the base and collector of a transistor which operates with a constant current are extracted to terminals, and a coil 14 or a capacitor 15 is inserted to stabilize the constant current.

The technique illustrated in FIG. 3, however, delays the rise time due to the resistor and the capacitor for removing overshoot, leading to a decrease in the driving frequency.

In the technique illustrated in FIG. 4, the number of package pins and the number of parts are increased.

In FIGS. 3 and 4, connecting terminals are denoted by 19, 20, 21, and 22.

The first invention of this application solves this problem.

The conventional circuit for switching the current of a semiconductor light emitting element at a high speed, a series circuit of a resistor 109 and a capacitor 110 as discrete circuit components, FIG. 5, is provided outside a package 116 which incorporates an integrated circuit 117, as illustrated in FIG. 6.

FIG. 5 is an equivalent circuit diagram of this prior art which includes parasitic elements (parasitic inductance components). FIG. 6 shows the packaged state of the circuit shown in FIG. 5. Referring to FIGS. 5 and 6, this circuit includes differentially connected bipolar transistors 1 and 2 formed in the integrated circuit 117; a constant current source 3; a semiconductor light emitting element 4; a resistor 5; a parasitic inductance 106 of the bonding wire for connecting the collectors of the bipolar transistors for driving the semiconductor light emitting element to the pin of the package 116; a parasitic inductance 107 of the pin; a parasitic inductance 108 of the line from the pin to the semiconductor light emitting element 4; the resistor 109; the capacitor 110; a parasitic inductance 112 resulting from the series connection of the resistor 109 and the capacitor 110; a power supply 15; complementary pulse signals 114 and 115 for driving the transistors 1 and 2; and the integrated circuit 117 including the transistors 1 and 2.

A semiconductor light emitting element needs to be switched at a high speed with a constant current of about a few milliamperes to 100 milliamperes. Assume that the value of this constant current is I and the values of the parasitic inductances 106, 107, 108, and 112 are $L_1$, $L_2$, $L_3$, and $L_4$, respectively. FIG. 7 is an approximate circuit in which the transistor 1, FIG. 5, is represented by a switch 118, and $L_1=L_2=0$ [H]. In FIG. 7, when the switch 118 is closed at time t=0, the following equations are established at a point A:

$$V_A = 1/C \cdot \int i_2 dt + L_4 \cdot di_1/dt + R i_2 \quad (1)$$

$$V_A = V_{cc} - L_3 \cdot di_1/dt \quad (2)$$

$$i_1 = i_2 + I \quad (3)$$

where $V_A$ is the potential at the point A and $V_{cc}$ is the power supply voltage.

By substituting Equation 3 into Equation 1 and differentiating, Equation 4 below is obtained:

$$dV_A/dt = 1/C(i_1 - I) + L_4 \cdot d^2 i_1/dt^2 + R \cdot di_1/dt \quad (4)$$

In addition, Equation 5 below is obtained by differentiating Equation 2:

$$dV_A/dt = -L_3 \cdot d^2 i_1/dt^2 \quad (5)$$

From Equations 4 and 5, Equation 6 below results:

$$(L_3 + L_4) \cdot d^2 i_1/dt^2 + R \cdot di_1/dt + 1/C(i_1 - I) = 0 \quad (6)$$

Characteristic equation $\phi(D)$ of Equation 6 is represented by $$\phi(D) = (L_3 + L_4) D^2 + R \cdot D + 1/C \quad (7)$$

Assuming the roots of $\phi(D)$ are $\lambda_1$ and $\lambda_2$, a transient solution is as follows:

$$i_1 = (\lambda_1 t)\text{th power of } K_1 \cdot e + (\lambda_2 t)\text{th power of } K_2 \cdot e (K_1 \text{ and } K_2 \text{ are constants}) \quad (8)$$

In a steady state after the switch 118 is closed, $i_1 = I$. Therefore, a general solution is given by Equation 9 below:

$$i_1 = I + (\lambda_1 t)\text{th power of } K_1 \cdot e + (\lambda_2 t)\text{th power of } K_2 \cdot e \quad (9)$$

Solving Equation 7 yields Equation 10 below:

$$D = -R/2(L_3 + L_4) \pm j\sqrt{(\omega_0^2 - \tau^{-2})} \quad (10)$$

$$= -\tau^{-1} \pm j\omega_f = \lambda_1, \lambda_2$$

where $\omega_0 = 1/\sqrt{(L_3+L_4)C}$, $\tau = 2(L_3+L_4)/R$, $\omega_f = \sqrt{(\omega_0^2 - \tau^{-2})}$ In Equation 10, since the value inside $\sqrt{}$ can be either positive or negative, the following three cases are possible:

(1) $\omega_0 > \tau^{-2}$
(2) $\omega_0 < \tau^{-2}$
(3) $\omega_0 = \tau^{-2}$ In case (1), both $\lambda_1$ and $\lambda_2$ are complex numbers, so $i_1$ becomes oscillatory. Differentiating Equation 9 yields Equation 11 below:

$$di_1/dt = (\lambda_1 t)\text{th power of } K_1 \lambda_1 \cdot e + (\lambda_2 t)\text{th power of } K_2 \lambda_2 \cdot e \quad (11)$$

Assuming in Equations 9 and 11 that, for t=0, $i_1=0$, t=∞, and $i_1=I$, $0 = I + K_1 + K_2$ and $0 = K_1 \lambda_1 + K_2 \lambda_2$ Therefore, $K_1 = \lambda_2 I/(\lambda_1 - \lambda_2)$ and $K_2 = -\lambda_1 I/(\lambda_1 - \lambda_2)$ Consequently Equation 12 below is obtained:

$i_1 = I[1 - \{-(t/\tau)\text{th power of } \omega_0/\omega_f \cdot e\} \cdot \sin(\omega_f t + \theta)]$ $\theta = \tan^{-1} \omega_f \tau \quad (12)$ Equation 12 indicates that the oscillation of the frequency $\omega_f$ logarithmically decreases according to the time constant $\tau$.

In case (2), both $\lambda_1$ and $\lambda_2$ are negative real numbers, so an unoscillating state results.

$\lambda_1, \lambda_2 = -\tau^{-1} \pm \omega_s$ where $\omega_s = j\omega_f$ $\omega_f = \sqrt{[\{R/2(L_3+L_4)\}^2 - \{1/\sqrt{((L_3+L_4)C)}\}^2]}$ The result is Equation 13 below:

$i_1 = I[1 - \{-(t/\tau)\text{th power of } \omega_0/\omega_s \cdot e\} \cdot \sin(\omega_s t + \theta)]$ $\theta = \tan^{-1} \omega_s \tau \quad (13)$ Consequently, $i_1$ changes logarithmically.

In case (3), $\lambda_1 = \lambda_2 = -\tau^{-1}$, which means a critical point. For $\omega_f = 0$,
$\omega_0 = \tau^{-1}$ $i_1 = I[1 - \{-(t/\tau)\text{th power of } \omega_0/\omega_s \cdot e\} \cdot \sin(\omega_f t + \theta)]$ For $\omega_f \to 0$, therefore, $i_1 = I\{1 + (-t/\tau)\text{th power of }(1+t/\tau) \cdot e\}$.

In cases (1), (2), and (3), the waveforms of the current flowing through the semiconductor light emitting element are as indicated by (a), (b), and (c), respectively, in FIGS. 8A to 8C. The waveform shown in FIG. 8A degrades the life of the semiconductor light emitting element because of occurrence of overshoot, leading to a short product life. The waveform shown in FIG. 8B increases the rise time to make high-speed switching impossible. The most desired waveform is as illustrated in FIG. 8C. In this case, Equation 14 below is obtained from Equation 11:

$$1/\sqrt{((L_3+L_4)C)} = R/2(L_3+L_4) \quad (14)$$

Consequently, the resistance of the resistor 109 and the capacitance of the capacitor 110 with which the rise time can be minimized can be determined from the values of the parasitic inductances $L_3$ and $L_4$.

Here, $L_1=L_2=0$ [H] assumed in the above quantitative consideration is important. Since it is assumed that $L_1=L_2=0$ [H], it is possible to determine the resistance of the resistor 109 and the capacitance of the capacitor 110 with which the rise time is minimized and no overshoot takes place. However, since conventional circuits make use of a resistor and a capacitor as discrete parts external to the package, the parasitic inductance 106 (=$L_1$) of the bonding wire and the parasitic inductance 107 (=$L_2$) of the pin of the package exist. Consequently, $L_1=L_2=0$ [H] cannot be established. This makes it difficult to prevent overshoot. To prevent overshoot, the capacitance of the capacitor 110 must be increased. Unfortunately, increasing the capacitance of the capacitor 110 lowers the operating speed.

The second invention of this application solves the above problem.

SUMMARY OF THE INVENTION

It is the first object of the present invention to realize a semiconductor light emitting element driving circuit capable of driving a semiconductor light emitting element with a stable driving current by eliminating distortion of the waveform of the driving current for the semiconductor light emitting element, thereby preventing deterioration of the semiconductor light emitting element and increasing the life of a product.

It is the second object of the present invention to provide a semiconductor light emitting element driving circuit capable of preventing a decrease in the driving frequency or increases in the number of package pins and the number of parts.

It is the third object of the present invention to provide a semiconductor light emitting element driving circuit for driving a light emitting element, comprising a bipolar transistor, the base of which is applied with a control signal for driving the light emitting element, and which, in response to the control signal, drives the light emitting element by flowing a current between the emitter and the collector, and a gate insulated transistor which operates as a constant current source connected to the bipolar transistor.

It is the fourth object of the present invention to provide a semiconductor light emitting element driving circuit for driving a light emitting element, comprising a bipolar transistor, the base of which is applied with a control signal for driving the light emitting element, and which, in response to the control signal, drives the light emitting element by flowing a current between the emitter and the collector, a constant current source connected to the bipolar transistor, and a series circuit inserted into a line between the bipolar transistor and the light emitting element and consisting of a resistor and a capacitor, wherein the bipolar transistor, the constant current source, and the series circuit are integrated into a single chip.

It is the fifth object of the present invention to provide a circuit which uses as its means a semiconductor light emitting element driving circuit which is a semiconductor integrated circuit in which differentially connected bipolar transistors and a MOS transistor are formed on the same substrate, and has a semiconductor light emitting element connected to and driven by the collectors of the differentially connected bipolar transistors, wherein the emitters of the differentially connected bipolar transistors are connected to the drain of the MOS transistor which operates as a constant current source and has the same conductivity type as that of the bipolar transistors. With this arrangement, the circuit can prevent overshoot or ringing taking place in the driving current of the semiconductor light emitting element by controlling the response of the constant current source by using a MOS transistor whose mutual conductance is small.

It is the sixth object of the present invention to provide a circuit in which a series circuit consisting of a resistor and a capacitor is formed in an integrated circuit, in which bipolar transistors are formed, and is connected between the collectors of the bipolar transistors and a power supply or a substrate potential. With this arrangement, the circuit can effectively suppress overshoot and prevent a decrease in the operating speed.

BRIEF DESCRIPTION OF THE DRAWINGS

FIG. 10 is a view for explaining voltage waveforms and current waveforms at individual nodes when the circuit in FIG. 9 is in operation;

FIGS. 11A to 11C are views showing semiconductor light emitting element driving current waveforms and constant current NMOS gate voltage waveforms when the present invention is practiced;

DETAILED DESCRIPTION OF THE PREFERRED EMBODIMENTS

Figure 1:
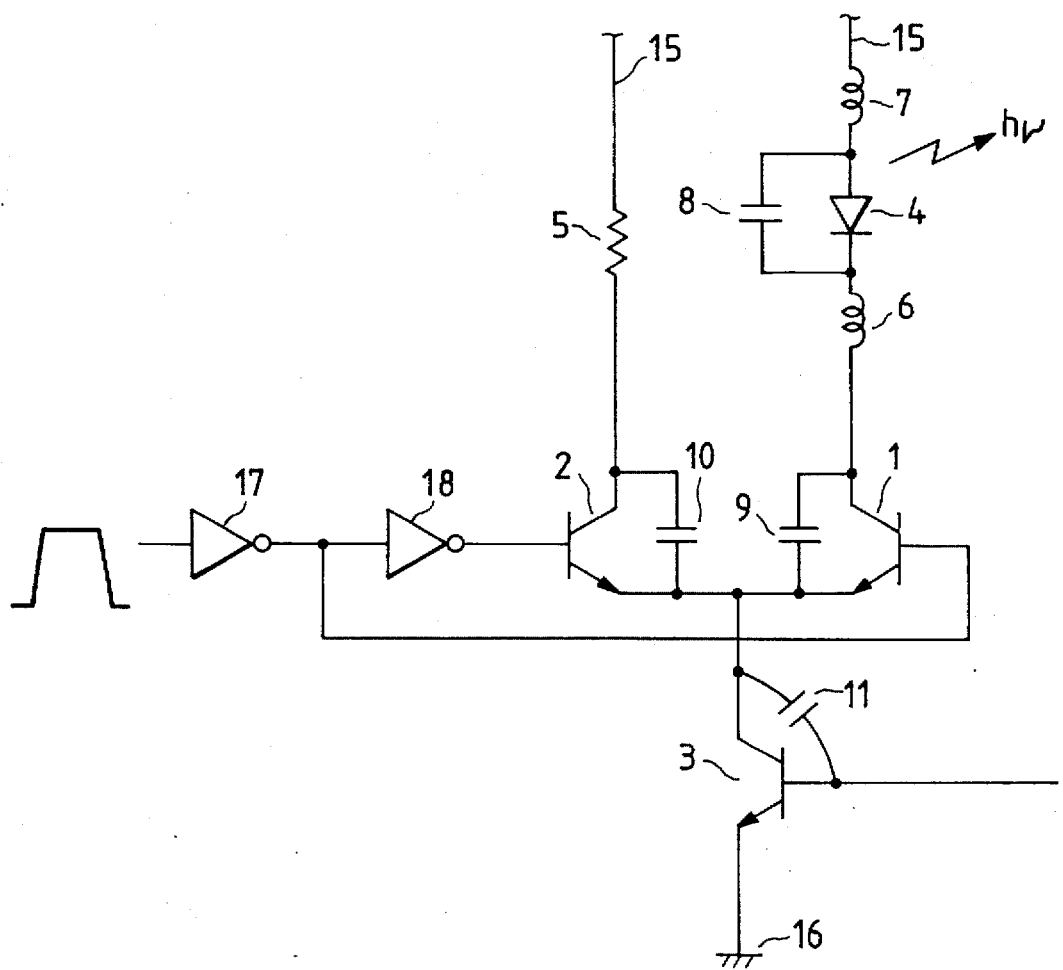
FIG. 1 is a circuit diagram showing a conventional semiconductor light emitting element driving circuit.
Figure 2:
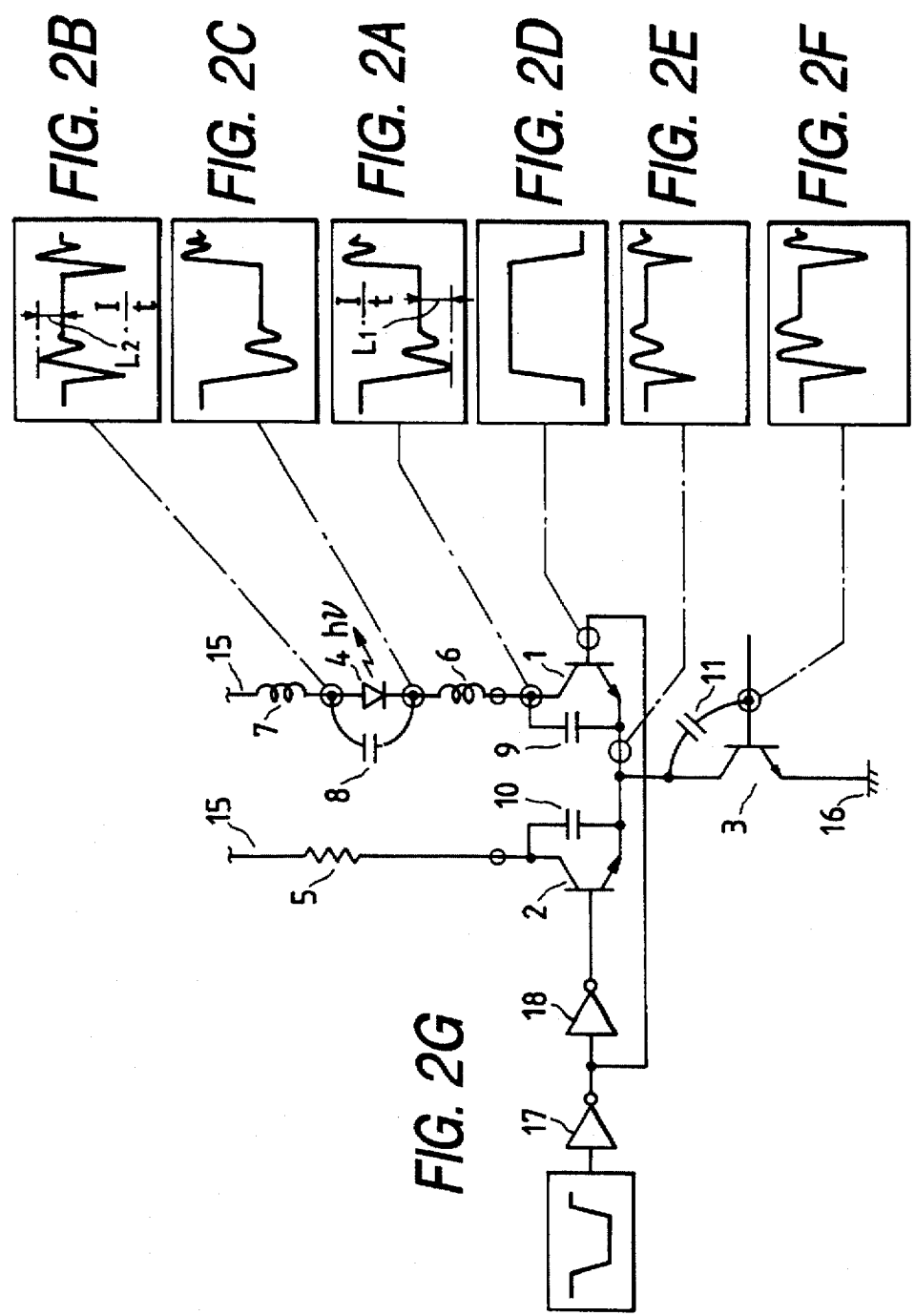
FIG. 2 is a view showing voltage waveforms and current waveforms at individual nodes when the circuit in FIG. 1 is in operation.
Figure 3:
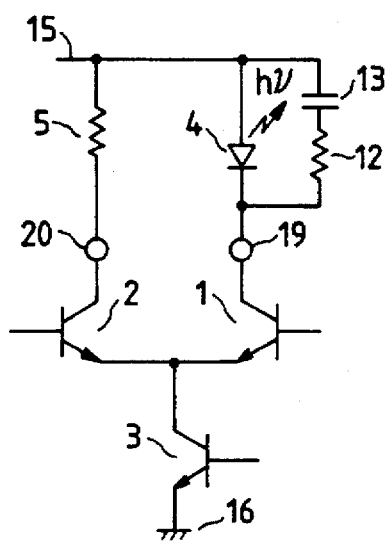
FIG. 3 is a circuit diagram showing another driving circuit.
Figure 4:
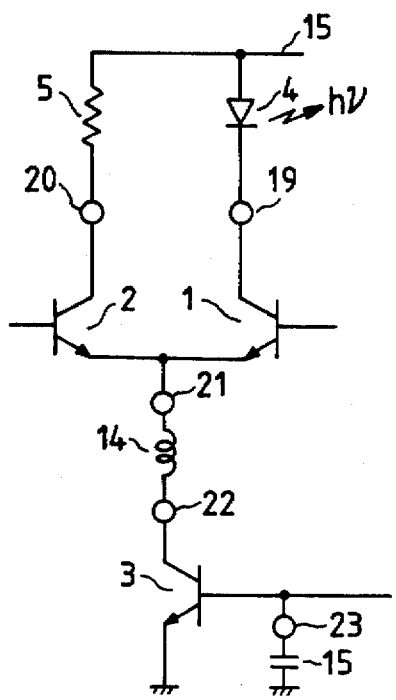
FIG. 4 is a circuit diagram showing still another driving circuit.

A basic arrangement of the present invention is a driving circuit comprising a bipolar transistor which is applied with a control signal for driving a light emitting element, and a constant current source for supplying a constant current to the bipolar transistor.

When an ON signal is applied as the control signal, the bipolar transistor is turned on to flow a current between the emitter and the base. This current is for driving the light emitting element and supplied from the constant current source.

One embodiment of the first invention of this application is a semiconductor light emitting element driving circuit which is a semiconductor integrated circuit having differentially connected bipolar transistors and a MOS transistor on the same substrate, which uses the differentially connected bipolar transistors as a switching circuit, and which has a light emitting element connected to and driven by the bipolar transistors. In this circuit, a constant current circuit using a MOS transistor is connected to the differentially connected bipolar transistors. With this arrangement, it is possible to suppress overshoot and ringing occurring in the driving current of the light emitting element by controlling the response of the constant current source by using a MOS transistor whose mutual inductance is small.

This driving circuit is also characterized in that a plurality of MOS transistors are connected in parallel. A MOS transistor such as one formed in the same integrated circuit as bipolar transistors as in the present invention, excluding those fabricated through some special process, such as power MOS transistors, is primarily used in a logical circuit. Therefore, a current which a MOS transistor handles is commonly 1 μA or lower. Consequently, a very large MOS transistor is necessary to obtain a current of several milliamperes to 100 milliamperes for driving a semiconductor light emitting element. The dimensions of such a MOS transistor obtained by simulation are a gate width of 2000 μm and a gate length of 3 μm. A MOS transistor of this size can no longer be handled as a lumped constant, so the current density sometimes varies in the transistor. To prevent this, it is preferable to connect a plurality of MOS transistors in parallel.

In addition, a semiconductor light emitting element driving circuit is characterized in that a time constant circuit formed in the same integrated circuit as the MOS transistor used as a constant current source and consisting of a resistor and a capacitor is connected to the gate of the MOS transistor. With this arrangement, the gate potential waveform can be controlled because the time constant is optimized. Consequently, it is possible to obtain a current waveform free from overshoot and ringing.

Furthermore, a semiconductor light emitting element driving circuit is characterized in that the base of the bipolar transistor is driven upon being applied with a complementary signal. Consequently, the bipolar transistor is switched without being saturated. This allows current switching at the highest speed.

That is, according to the present invention, a MOS transistor is used as a constant current source connected to the emitters of differentially connected bipolar transistors, and, if necessary, a time constant circuit consisting of a resistor and a capacitor is connected to the gate of the MOS transistor. This makes it possible to obtain a high-speed current pulse waveform free from overshoot and ringing.

In the second invention of this application, a switching circuit consisting of a pair of differentially connected bipolar transistors and a series circuit consisting of a resistor and a capacitor are integrated into a one-chip IC.

This circuit is more preferably a driving circuit in which a driving means having a switching circuit consisting of a pair of differentially connected bipolar transistors and a constant current circuit constituted by a MOS transistor is connected to the cathode of a light emitting element. In this circuit configuration, the series circuit of the resistor and the capacitor is connected to the cathode of the light emitting element, and the driving circuit and the series circuit are integrated into one chip.

These driving circuits can be realized as a one-chip IC by using well-known IC process techniques. It is also possible to fabricate the circuits by using a compound semiconductor such as gallium arsenide or indium phosphorus. When a driving circuit is to be fabricated by using the same compound semiconductor as a light emitting element, it is readily possible to integrate the two into one chip.

(First Embodiment)

Figure 9:
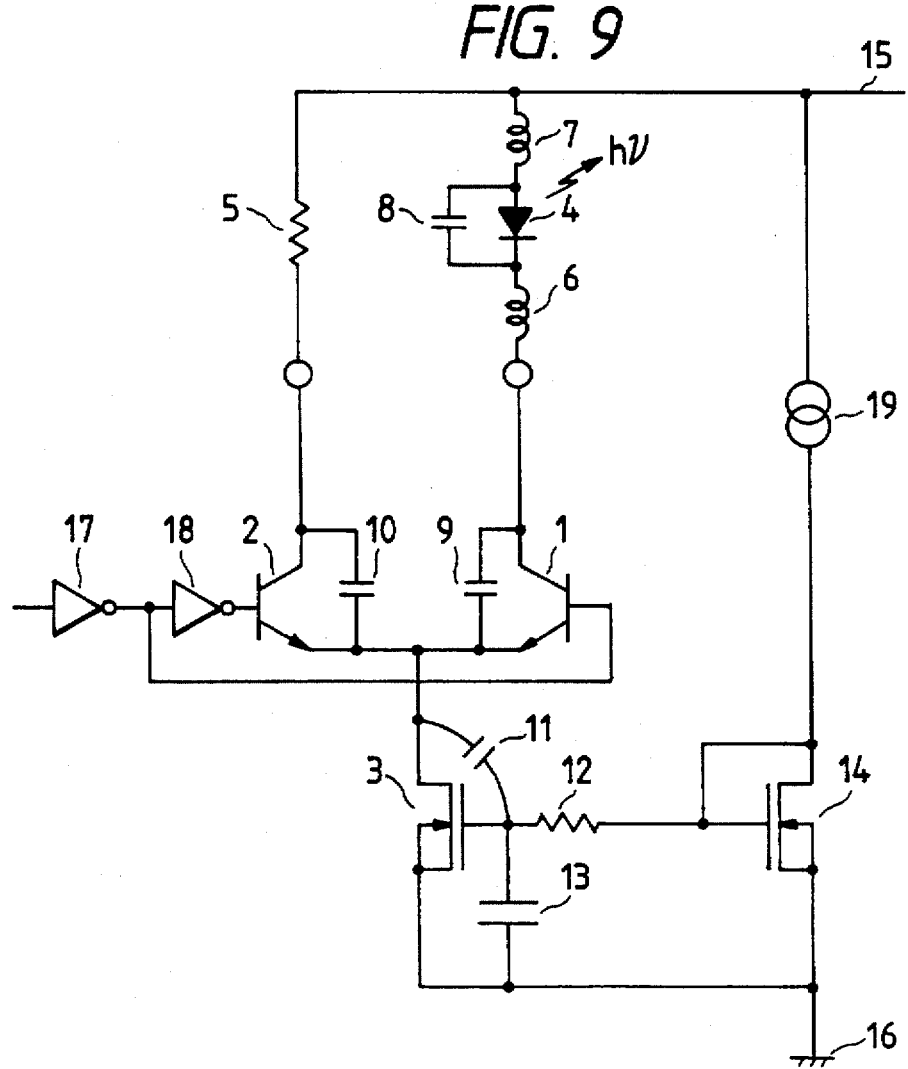
FIG. 9 is a circuit diagram showing a semiconductor light emitting element driving circuit according to the first embodiment of the present invention.

FIG. 9 is a circuit diagram showing a semiconductor light emitting element driving circuit according to the first embodiment of the present invention. Referring to FIG. 9, npn transistors 1 and 2 are differentially connected. An NMOS transistor 3 has a drain connected to the common emitter of the npn transistors 1 and 2 and operates with a constant current. A semiconductor light emitting element 4 has a cathode connected to the collector of the npn transistor 1 via a parasitic inductance 6 of a line. A resistor 5 as a load is connected to the collector of the npn transistor 2. A parasitic inductance 7 is due to the line between the anode of the semiconductor light emitting element 4 and a power supply 15 as a high-potential reference voltage source. The semiconductor light emitting element 4 has a junction capacitance $C_j$, 8. The npn transistors 1 and 2 have emitter-collector capacitances 9 and 10, respectively. The NMOS transistor 3 which operates as a constant current source has a drain-gate capacitance 11. One end of a resistor 12 is connected to the gate of the NMOS transistor 3 and to one end of a capacitor 13. The other end of the resistor 12 is connected to the gate and drain of an NMOS transistor 14 for applying a bias potential. The other end of the capacitor 13 is connected to a ground potential 16 as a low-potential reference voltage source. Inverters 17 and 18 supply complementary switching signals to the bases of the differentially connected npn transistors. A constant current source 19 supplies a constant current to the NMOS transistor 14.

FIG. 10 is a view showing voltage waveforms and current waveforms at individual nodes in the first embodiment. The operation of this embodiment will be described below with reference to FIG. 10.

The inverter 17 applies a High-level signal to the base of the npn transistor 1, and the inverter 18 applies a Low-level signal to the base of the npn transistor 2. Consequently, the npn transistor 1 is activated, and the npn transistor 2 is cut off. The collector current of the npn transistor 1, i.e., the driving current of the semiconductor light emitting element changes from 0 to a drain current I of the NMOS transistor 3, which operates with a constant current, in a certain time t. As indicated by (a) and (b) in FIG. 10, the current change I in the time t generates counterelectromotive voltage pulses $L_1 \cdot I/t$ and $L_2 \cdot I/t$ due to the parasitic inductances 6 (=$L_1$) and 7 (=$L_2$), respectively. These counterelectromotive voltage pulses are transmitted to the gate of the NMOS transistor 3 through the junction capacitance 8 of the semiconductor light emitting element, the emitter-collector capacitance 9 of the npn transistor 1, and the gate-drain capacitance 11 of the NMOS transistor 3. Potential variations at the emitters of the npn transistors 1 and 2 are illustrated in (e) of FIG. 10, i.e., indicated by the solid-line waveform which is generated by the complementary driving signals to the bases and the dotted-line waveform which is synthesized with the counterelectromotive voltage pulses, respectively. Consequently, the dotted-line potential waveform shown in (f) of FIG. 10 is generated at the gate of the NMOS transistor.

The mutual inductance, $g_m$, of the NMOS transistor is represented by $$g_m = \sqrt{(I_D \cdot \mu_n C_{ox} W/L)}$$

where
$I_D$: the drain current
$\mu_n$: the mobility of electrons
$C_{OX}$: the gate capacitance
W: the channel width
L: the channel length The above equation demonstrates that the mutual conductance of a MOS transistor is far smaller than that of a bipolar transistor. This indicates that the influence of a potential variation at the gate is small as a change in the drain current.

Furthermore, in this embodiment the resistor 12 and the capacitor 13 are connected to the gate of the NMOS transistor 3. Consequently, the behavior of the gate potential is controlled by time constant $\tau = C_G \cdot R_G$. That is, the gate potential responds to high-speed pulses by the time constant $\tau$.

In FIGS. 11A to 11C indicate the driving current waveforms of the semiconductor light emitting element and gate voltage waveforms obtained while changing the time constant obtained by the resistor 12 and the capacitor 13 connected to the gate of the NMOS transistor 3 which operates with a constant current. FIGS. 11A to 11C show that when the time constant is made most suitable, a current waveform free from overshoot and ringing can be obtained.

It is preferable to realized a MOS transistor 3 by connecting MOS transistors in parallel, which are individually formed in a plurality of active regions formed on an Si substrate and isolated by a field insulating film made from $SiO_2$ as a dielectric substance.

(Second Embodiment)

Figure 12:
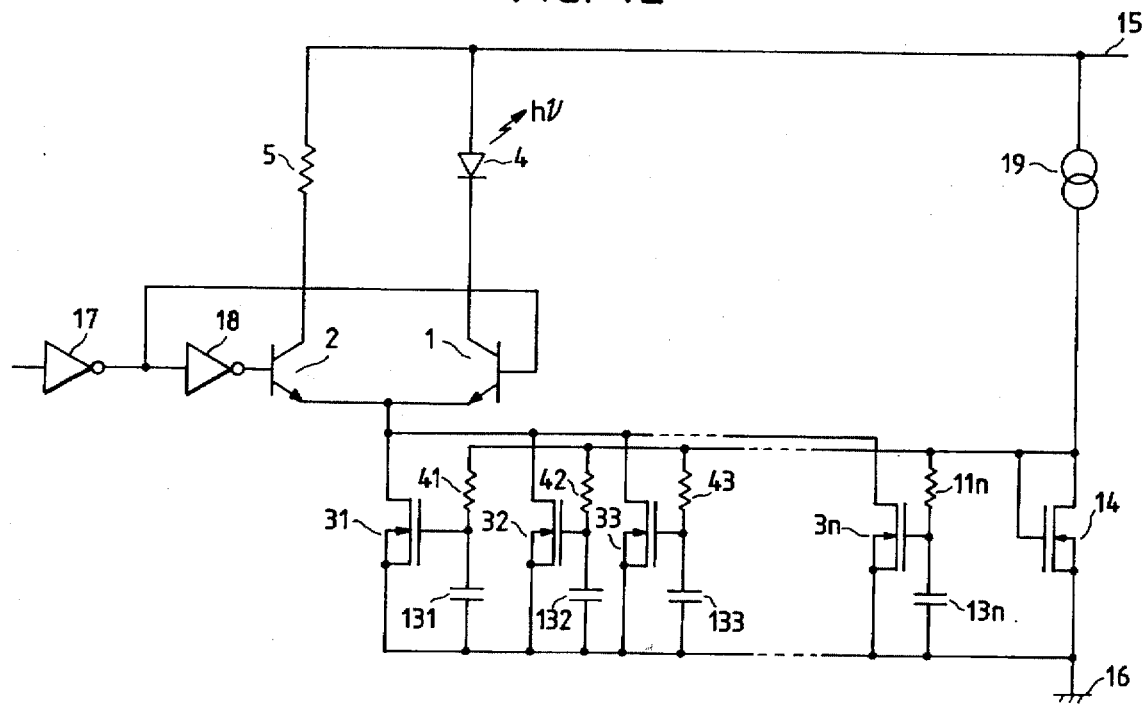
FIG. 12 is a circuit diagram showing a driving circuit according to the second embodiment of the present invention.

FIG. 12 is a circuit diagram showing a semiconductor light emitting element driving circuit according to the second embodiment of the present invention. In this embodiment, a plurality of NMOS transistors are connected in parallel, and a resistor and a capacitor are connected to the gate of each MOS transistor.

This is so because, if the W/L of an NMOS transistor is increased to obtain a necessary driving current, the behavior of the gate must be considered as a distribution constant circuit, i.e., it is not possible to handle the transistor as a lumped constant, and this makes an optimum design for the circuit difficult.

As discussed above, a MOS transistor is used as a constant current source connected to the emitters of differentially connected bipolar transistors. Additionally, a time constant circuit consisting of a resistor and a capacitor is connected to the gate of this MOS transistor. Consequently, it is possible to obtain a current pulse waveform free from overshoot and ringing.

Since a semiconductor light emitting element is driven with a stable driving current, the element does not deteriorate. This effectively increases the life of the product.

It is also possible to solve the problem of a decrease in the driving frequency which is due to conventional countermeasures or the problem of an increase in the number of package pins and the number of parts.

(Third Embodiment)

Figure 13:
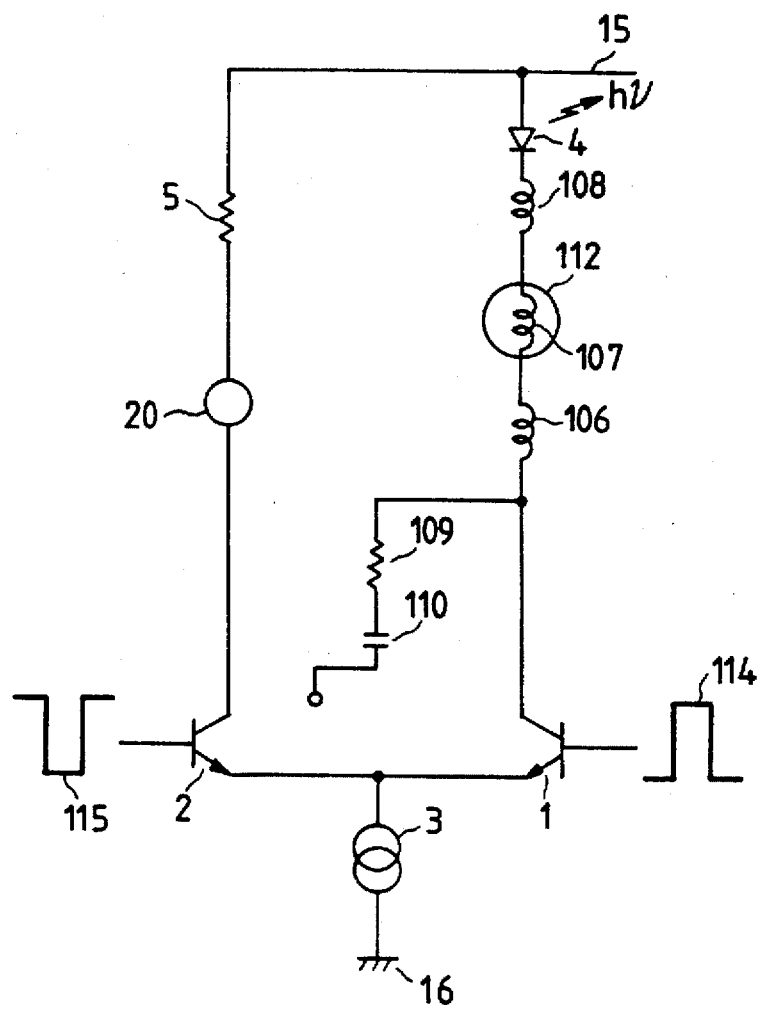
FIG. 13 is a circuit diagram showing a driving circuit according to the third embodiment of the present invention.

A semiconductor light emitting element driving circuit according to the third embodiment of the present invention will be described below. FIG. 13 is a circuit diagram showing the semiconductor light emitting element driving circuit. Referring to FIG. 13, this driving circuit comprises differentially connected bipolar transistors 1 and 2 formed in an integrated circuit (not shown), a constant current source 3, a semiconductor light emitting element 4, a resistor 5, parasitic inductances 106, 107, and 108, a resistor 109, and a capacitor 110. The parasitic inductance 106 is due to the bonding wire connecting the collectors of the bipolar transistors for driving the semiconductor light emitting element to the pin of a package 116. The parasitic inductance 107 is due to the pin, and the parasitic resistance 108 is derived from the line from the pin to the semiconductor light emitting element 4. The resistor 109 is formed in the integrated circuit in which the bipolar transistors are formed. The capacitor 110 is also formed in the same integrated circuit. The resistor 109 and the capacitor 110 are connected in series in the integrated circuit. One terminal of this series circuit is connected to the collectors of the bipolar transistors for driving the semiconductor light emitting element. The other terminal of the series circuit is connected to a power supply 15 or a substrate potential. The transistors 1 and 2 are driven by complementary signals 114 and 115, respectively.

Figure 5:
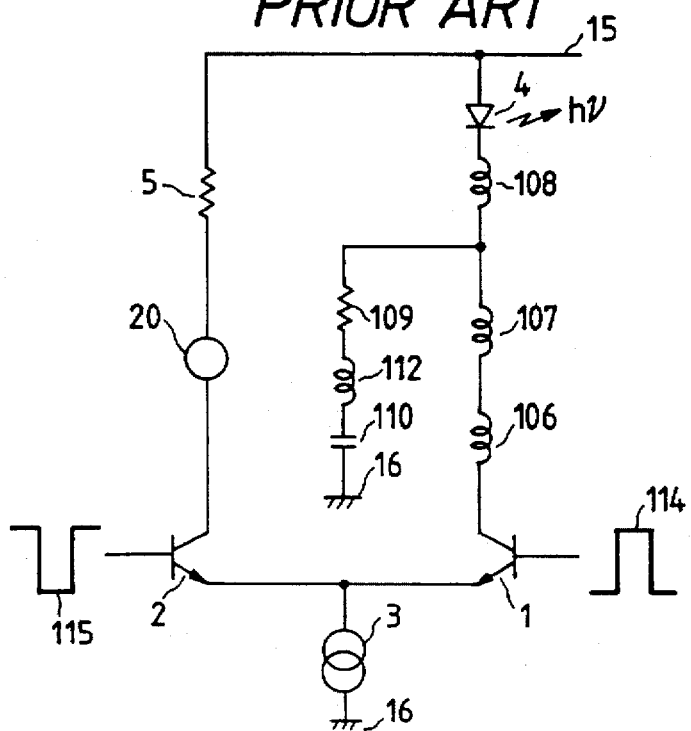
FIG. 5 is a circuit diagram showing a conventional semiconductor light emitting element driving circuit.
Figure 6:
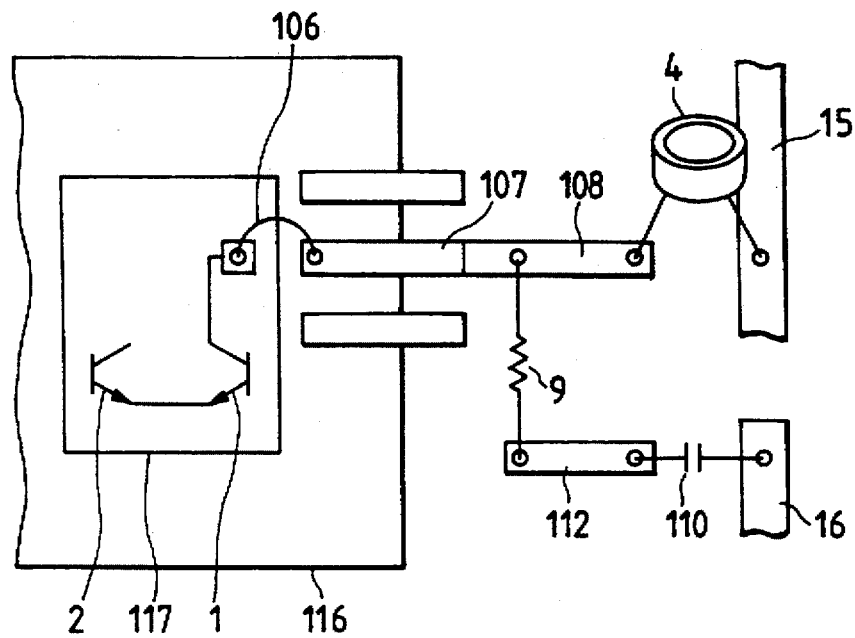
FIG. 6 is a view showing the packaged state of the circuit in FIG. 5.
Figure 7:
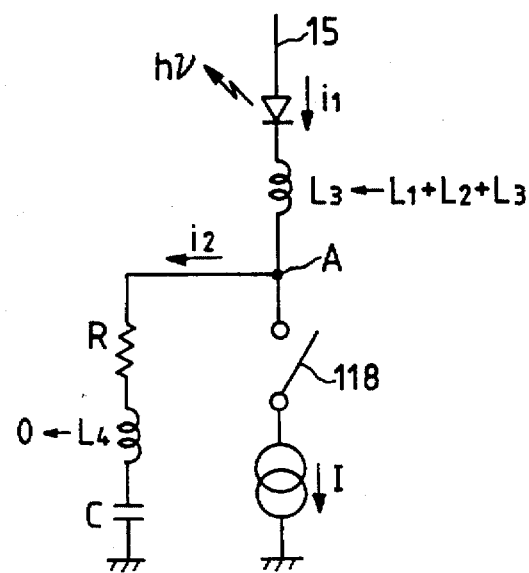
FIG. 7 is an approximate circuit diagram of FIG. 5.
Figure 8A:
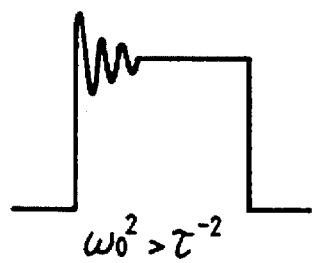
FIGS. 8A to 8C are views showing driving current waveforms.
Figure 8B:
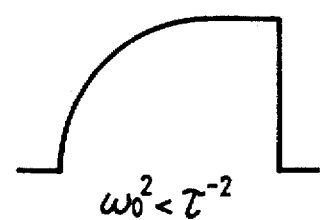
Figure 8C:
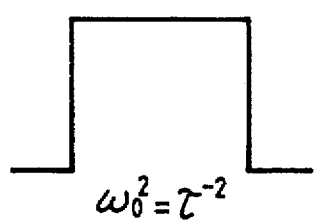

Assuming an approximate circuit, such as shown in FIG. 7, of this circuit configuration in FIG. 13, if synthetic inductance $L_1+L_2+L_3$ of the parasitic inductances 106, 107, and 108 is again replaced with $L_3$, this $L_3$ corresponds to $L_3$ indicated by the arrow in FIG. 7. In addition, the parasitic inductance 112, i.e., $L_4$ in FIG. 5 illustrating the prior art, can be set to nearly 0, since the CR series circuit is formed in the integrated circuit. That is, the parasitic inductance produced in the prior art between the collectors of the bipolar transistors for driving the semiconductor light emitting element and the CR series circuit can be decreased to 0. In other words, in the case of this prior art $L_1=L_2=0$ is accomplished.

In the previously mentioned case, Equation 14 yields Equation 15 below because $L_4=0$:

$$1/\sqrt{(L_3 C)} = R/2L_3 \qquad (15)$$

For this reason, by properly choosing the resistance, R, of the resistor 109 and the capacitance, C, of the capacitor 110 in association with the parasitic resistance $L_3$, the current flowing through the semiconductor light emitting element when complementary pulse signals are applied to the semiconductor light emitting element driving circuit can be set in a critical state which is between the state in which the current varies in an oscillating manner and the state in which the current varies in an unoscillating manner.

(Fourth Embodiment)

In this embodiment, a constant current circuit denoted by reference numeral 3 in FIG. 13 is constituted by MOS transistors such as shown in FIG. 12.

In the semiconductor light emitting element driving circuit in each of the third and fourth embodiments as described above, a series circuit which consists of a resistor and a capacitor and is conventionally arranged outside an integrated circuit in which bipolar transistors are formed is directly connected to the collectors of the bipolar transistors in the integrated circuit. Therefore, a parasitic inductance that is produced in conventional circuits is not generated between the collectors of the bipolar circuits for driving the semiconductor light emitting element and the series circuit. Consequently, by properly choosing the resistance of the resistor and the capacitance of the capacitor in association with the parasitic resistance occurring outside the circuit, the current flowing through the semiconductor light emitting element when complementary pulse signals are applied to the semiconductor light emitting element driving circuit can be set in a critical state which is between the state in which the current varies in an oscillating manner and the state in which the current varies in an unoscillating manner. With this setting, it is possible to prevent overshoot and perform high-speed switching in the semiconductor light emitting element driving circuit.

Figure 14:
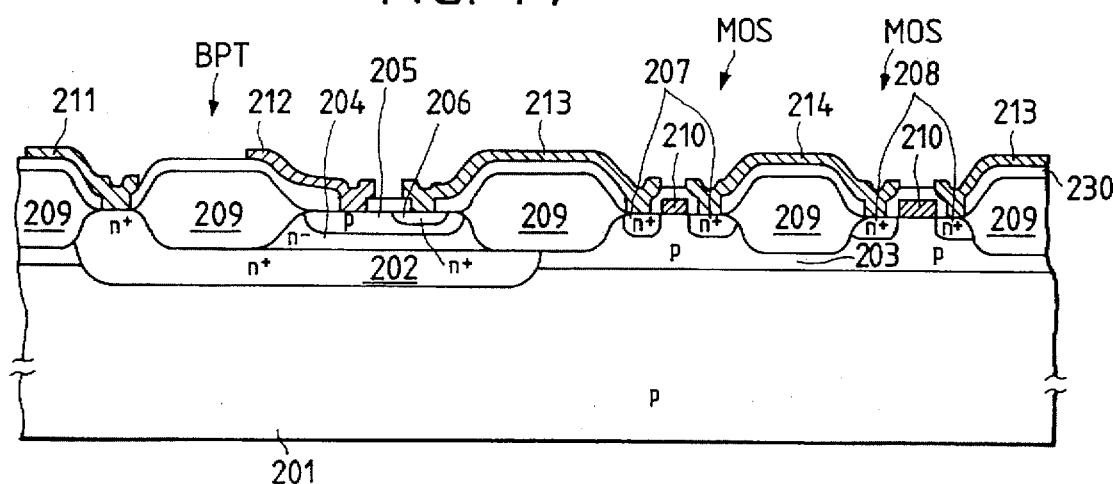
FIG. 14 is a sectional view showing a portion of a driving circuit chip according to the embodiments of the present invention.

FIG. 14 is a sectional view showing a portion of an IC chip in which the driving circuit of the present invention is formed. In FIG. 14, only one bipolar transistor BPT and two MOS transistors MOS are illustrated, and other components such as a protective layer are omitted. The parts shown in FIG. 14 are a p-type silicon substrate 201, an $n^+$-type collector buried layer 202, a p-type well 203, an $n^-$-type epitaxial layer 204, a p-type base 205, and an $n^+$-type emitter 206.

The two NMOS transistors MOS have sources/drains 207 and 208 and gates 210. A field insulating film 209 isolates the elements.

A collector line 211 of the bipolar transistor is connected to the terminal of a light emitting element. A base line 212 serves as an input terminal, and a line 213 connects a constant current source to the bipolar transistor. A ground line 214 is connected to a low-potential reference voltage source.

Figure 15:
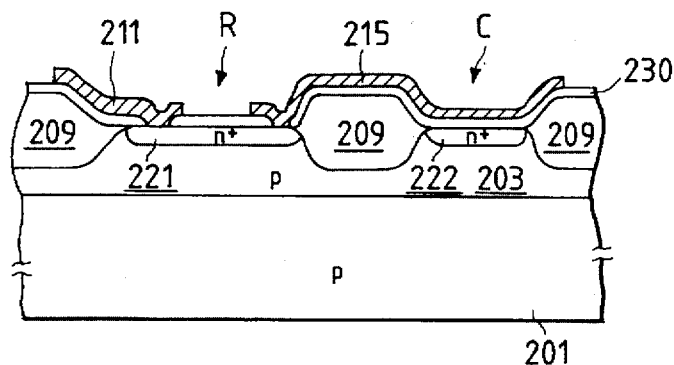
FIG. 15 is a sectional view showing a portion of a driving circuit chip according to the embodiments of the present invention.

FIG. 15 is a sectional view showing a portion of an IC chip in which a series circuit of a resistor R and a capacitor C is formed.

In this series circuit in FIG. 15, $n^+$-type diffusion layers 221 and 222 are formed, and a series connecting line 215 connects the resistor R and the capacitor C. The circuit also includes an insulating interlayer 230.

In the present invention, a driving circuit is formed into a single chip as illustrated in FIG. 14 by a fabrication method called a BiMOS process or a BiCMOS process. If necessary, the series circuit shown in FIG. 15 is also monolithically integrated with the driving circuit.

Figure 16A:
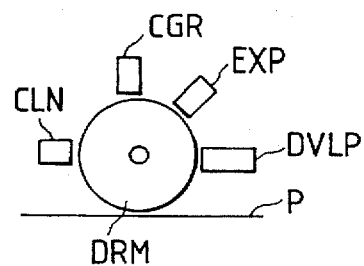
FIGS. 16A and 16B are schematic views showing the arrangements of systems using the driving circuit of the present invention.
Figure 16B:
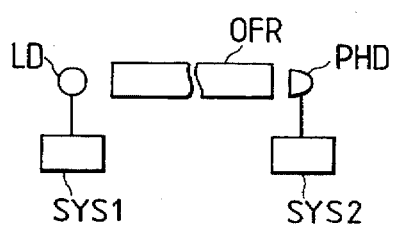

FIGS. 16A and 16B illustrate examples of systems using the circuit of the present invention. FIG. 16A shows a printer, and FIG. 16B shows an optical communication system.

The printer shown in FIG. 16A comprises a photosensitive drum DRM, a cleaner CLN, a charger CGR, and an exposure unit EXP which employs the driving circuit of the present invention, a developing unit DVLP, and a recording medium P.

The exposure unit EXP uses an LED array or a laser diode as a light emitting element and forms latent images on the photosensitive drum by using light from the light emitting element.

In the communication system shown in FIG. 16B, the transmission side includes a laser diode LD as a light emitting element and a transmitter SYS1 with a driving circuit, and the reception side includes a photodiode sensor PHD and a receiver SYS2.

An optical fiber OFR also is provided.

The present invention is adopted in the transmitter SYS1.

What is claimed is:

1. A semiconductor light emitting element driving circuit for driving a semiconductor light emitting element, comprising:

a reference voltage source;

a first bipolar transistor having a base, a collector, and an emitter, wherein said semiconductor light emitting element is connected between said reference voltage source and said collector, and said base of said first bipolar transistor is supplied with a first signal;

a second bipolar transistor having a collector and an emitter, and having a base which is supplied with a second signal complementary to the first signal;

a resistor connected between said reference voltage source and said collector of said second bipolar transistor;

a constant current circuit comprising a first insulated gate-type transistor having a source, a drain and a gate, and at least two other insulated gate-type transistors each having a source, a drain and a gate; and a constant current source, a first end of which is connected to said reference voltage source, said drain of said first insulated gate-type transistor being connected to a second end of said constant current source, said drains of said other insulated gate-type transistors being respectively connected to said emitters of said first and second bipolar transistors, and said gates of said other insulated gate-type transistors being respectively connected to said drain of said first insulated gate-type transistor; wherein said sources of said first and said other insulated gate-type transistors are commonly connected, and said gates of said other insulated gate-type transistors are each connected to a time constant circuit including a resistor and a capacitor.

2. A circuit according to claim 1, wherein said first and second bipolar transistors and said insulated gate-type transistors are integrated on one chip.

3. A circuit according to claim 1, wherein said time constant circuit, said first and second bipolar transistors and said insulated gate-type transistors are integrated on one chip.

4. A circuit according to claim 1, wherein said collector of said first bipolar transistor is connected to a series circuit comprising a resistor and a capacitor.

5. A circuit according to claim 1, further comprising a series circuit of a resistor and a capacitor provided between said reference voltage source, or a substrate voltage, and said collector of said first bipolar transistor.

6. A circuit according to claim 1, further comprising an inverter provided between said respective bases of said first and second bipolar transistors.

7. A circuit according to claim 4 or 5, wherein by properly selecting (1) a resistance of said resistor of said series circuit and (2) a capacitance of said capacitor of said series circuit in relation to (3) a parasitic inductance occurring outside said circuit, a current flowing through said semiconductor light emitting element when the first and second signals are respectively supplied to said bases of said first and second bipolar transistors is in a critical state, the critical state being between a state in which the current oscillates and a state in which the current does not oscillate.

8. A semiconductor light emitting element driving circuit for driving a semiconductor light emitting element comprising:

a first bipolar transistor having a base, an emitter and a collector, said first bipolar transistor being connected to a first terminal for supplying through the semiconductor light emitting element a current;

a second bipolar transistor having a base, an emitter and a collector, said second bipolar transistor connected to a second terminal through a resistor, said emitter of said first bipolar transistor commonly connected to said emitter of said second bipolar transistor;

an inverter for inputting a signal into said base of said second bipolar transistor complementary to a signal input into said base of said first bipolar transistor; and a constant current circuit connected to said emitters of said first and second bipolar transistors, said constant current circuit comprising a plurality of insulated gate-type transistors with drains connected to said emitter of said first bipolar transistor, and another insulated gate-type transistor for supplying a bias voltage to all gates of said plurality of insulated gate-type transistors, wherein each gate of said plurality of insulated gate-type transistors is connected to a time constant circuit including a resistor and a capacitor.

9. A circuit according to claim 8, wherein said insulated gate-type transistors comprise transistors formed on plural active regions on a substrate, said plural active regions being isolated by a dielectric.

10. A printer comprising:

photosensitive means for forming an image;

cleaner means for cleaning said photosensitive means;

charger means for charging said photosensitive means with an electrical charge; and exposure means for exposing said photosensitive means with light, said exposure means having a driving circuit including a reference voltage source, a first bipolar transistor having a base, a collector, and an emitter, wherein a semiconductor light emitting element is connected between said reference voltage source and said collector, and said base of said first bipolar transistor is supplied with a first signal, a second bipolar transistor having a collector and an emitter, and having a base which is supplied with a second signal complementary to the first signal, a resistor connected between said reference voltage source and said collector of said second bipolar transistor, a constant current circuit comprising a first insulated gate-type transistor having a source, a drain and a gate, and at least two other insulated gate-type transistors each having a source, a drain and a gate, and a constant current source, a first end of which is connected to said reference voltage source, said drain of said first insulated gate-type transistor being connected to a second end of said constant current source, said drains of said other insulated gate-type transistors being respectively connected to said emitters of said first bipolar transistors, and said gates of said other insulated gate-type transistors being respectively connected to said drain of said first insulated gate-type transistor; wherein said sources of said first and said other insulated gate-type transistors are commonly connected, and each of said gates of said other insulated gate-type transistors are connected to a time constant circuit including a resistor and a capacitor.

11. A light emitting device comprising:

a driving circuit according to claim 1 or 8, wherein said semiconductor light emitting element comprises a laser diode or a LED.

12. A printer comprising:

photosensitive means for forming an image;

cleaner means for cleaning said photosensitive means;

charger means for charging said photosensitive means with an electrical charge; and exposure means for exposing said photosensitive means with light, said exposure means having a driving circuit including a first bipolar transistor having a base, an emitter and a collector, and said first bipolar transistor being connected to a first terminal for supplying through a semiconductor light emitting element a current, a second bipolar transistor having a base, an emitter and a collector, said second bipolar transistor connected to a second terminal through a resistor, said emitter of said first bipolar transistor commonly connected to said emitter of said second bipolar transistor, an inverter for inputting a signal into said base of said second bipolar transistor complementary to a signal input into said base of said first bipolar transistor, and a constant current circuit connected to said emitters of said first and second bipolar transistors, said constant current circuit comprising a plurality of insulated gate-type transistors with drains connected to said emitter of said first bipolar transistor, and another insulated gate-type transistor for supplying a bias voltage to all gates of said plurality of insulated gate-type transistors, wherein each gate of said plurality of insulated gate-type transistors is connected to a time constant circuit including a resistor and a capacitor.

* * * * *